United States Patent [19]
Love et al.

[11] Patent Number: 5,514,906
[45] Date of Patent: May 7, 1996

[54] APPARATUS FOR COOLING SEMICONDUCTOR CHIPS IN MULTICHIP MODULES

[75] Inventors: David G. Love, Pleasanton; Larry L. Moresco, San Carlos; David A. Horine, Los Altos; Wen-chou V. Wang, Cupertino; Richard L. Wheeler, San Jose; Patricia R. Boucher, Mountain View; Vivek Mansingh, Santa Clara, all of Calif.

[73] Assignee: Fujitsu Limited, Japan

[21] Appl. No.: 150,456

[22] Filed: Nov. 10, 1993

[51] Int. Cl.⁶ .................................................. H01L 23/34
[52] U.S. Cl. .......................... 257/712; 257/714; 257/720
[58] Field of Search ................................ 257/712, 714, 257/715, 716, 720, 721, 722; 361/679, 689, 698, 699

[56] References Cited

U.S. PATENT DOCUMENTS

| | | | |
|---|---|---|---|
| 3,946,276 | 3/1976 | Braun et al. | 317/100 |
| 4,050,507 | 9/1977 | Chu et al. | 165/1 |
| 4,067,104 | 1/1978 | Tracy | 29/626 |
| 4,312,012 | 1/1982 | Frieser et al. | 357/82 |
| 4,450,472 | 5/1984 | Tuckerman et al. | 357/82 |
| 4,561,040 | 12/1985 | Eastman et al. | 361/385 |
| 4,694,378 | 9/1987 | Nakayama et al. | 361/385 |
| 4,884,331 | 12/1989 | Hinshaw | 29/558 |
| 5,001,548 | 3/1991 | Iverson | 257/714 |
| 5,053,856 | 10/1991 | Davidson | 357/82 |
| 5,065,277 | 11/1991 | Davidson | 361/383 |
| 5,077,601 | 12/1991 | Hatada et al. | 357/81 |
| 5,079,619 | 1/1992 | Davidson | 357/81 |
| 5,103,374 | 4/1992 | Azar | 361/382 |
| 5,145,001 | 9/1992 | Valenzuela | 165/164 |
| 5,168,348 | 12/1992 | Chu et al. | 257/714 |
| 5,270,572 | 12/1993 | Nakajima et al. | 257/714 |

FOREIGN PATENT DOCUMENTS

| | | | |
|---|---|---|---|
| 1024447 | 1/1989 | Japan | 257/714 |
| 2007456 | 1/1990 | Japan | 257/714 |

OTHER PUBLICATIONS

Schwartz, "Microelectronics Packaging: II," *Ceramic Bulletin*, vol. 63, No. 4 (1984), pp. 577–581.

*Primary Examiner*—Sara W. Crane
*Assistant Examiner*—Jhihan Clark
*Attorney, Agent, or Firm*—Coudert Brothers

[57] ABSTRACT

A compact, reliable, and efficient cooling system for semiconductor chips is disclosed. In one embodiment, a plurality of semiconductor chips have their active surfaces mounted to a major substrate which provides electrical connections among the chips, and a cooling channel is formed above the major substrate and each chip for conducting a cooling fluid over the back surface of the chips. To increase cooling efficiency, heat sink arrays are formed on the back surfaces of the chips, each array including a plurality of heat conducting elements attached to the back surface. The arrays may be readily and inexpensively constructed with photolithography or wire bonding techniques. To control the flow of cooling fluid around the chip edges and to prevent cavitation of the cooling fluid a cavitation and flow control plate disposed at the bottom surface of the cooling channel and formed around the edges of the chips is included. With the increased cooling efficiency, the height of each cooling channel may be substantially reduced to allow close stacking of interconnect substrates for three-dimensional packages and to shorten the vertical communication time between the interconnect substrates.

40 Claims, 6 Drawing Sheets

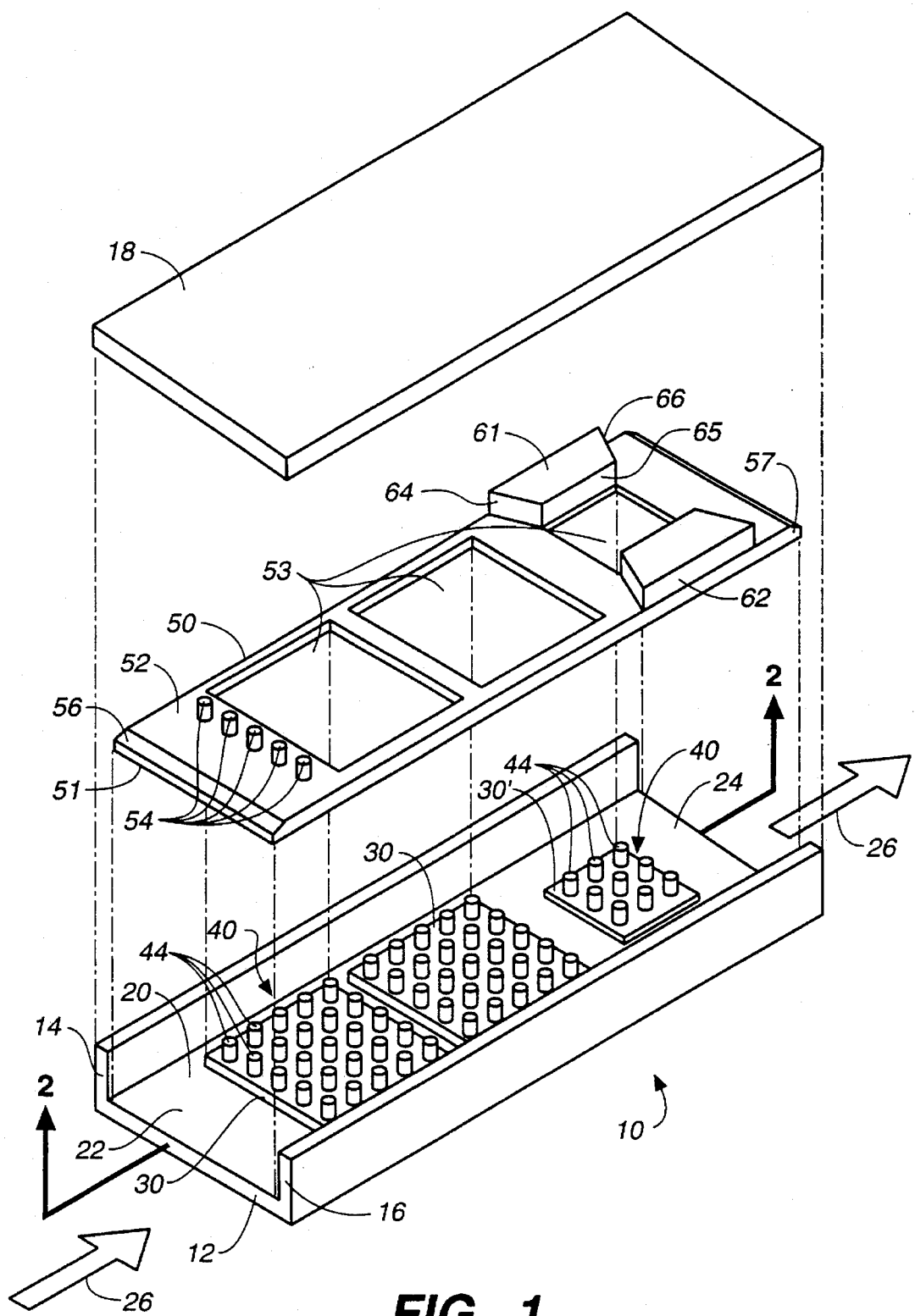
FIG._1

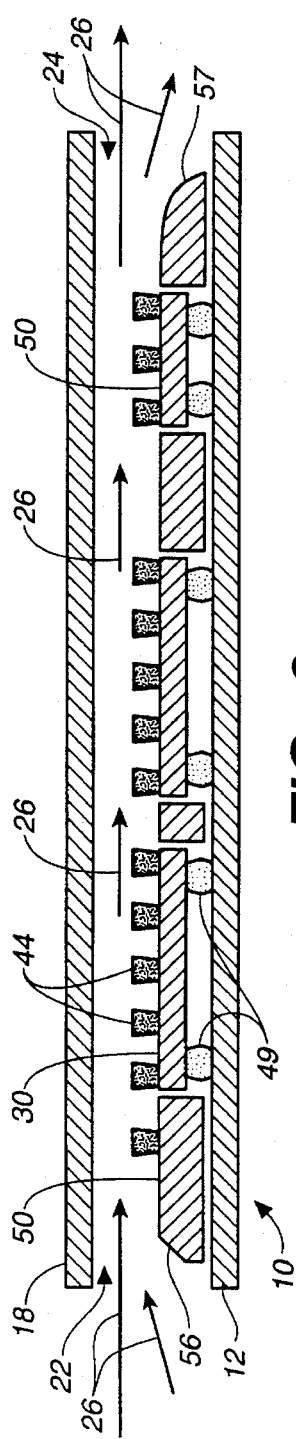
FIG._2
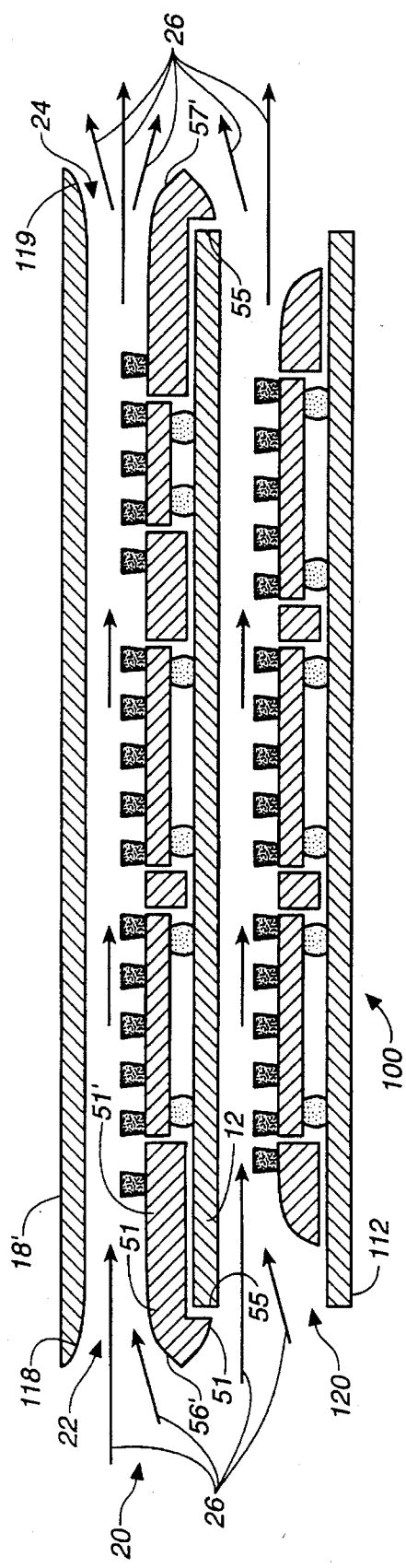
FIG._4

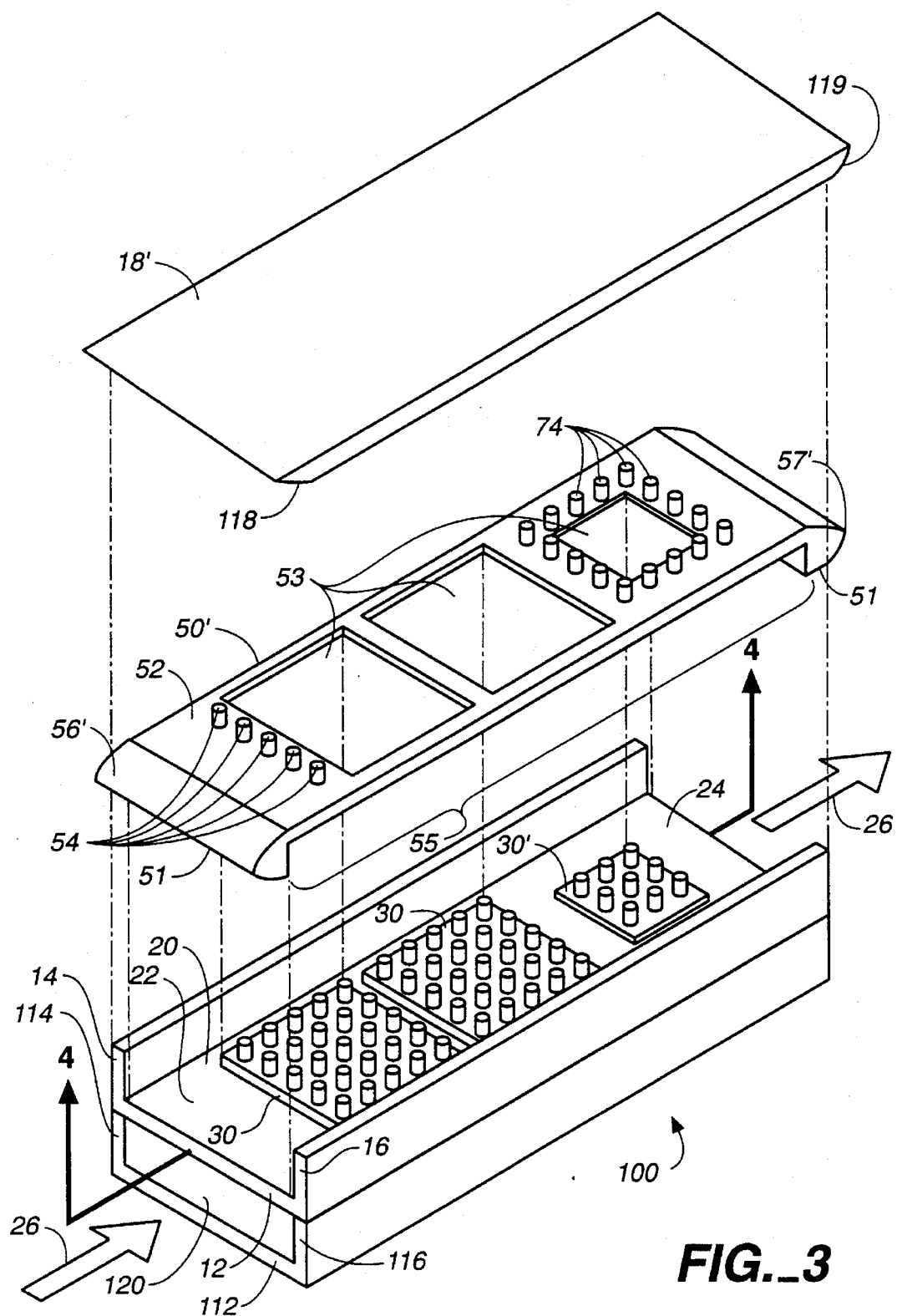
FIG._3

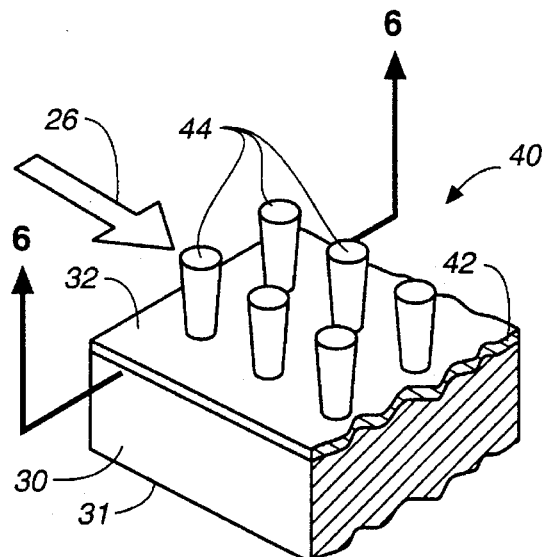
FIG._5
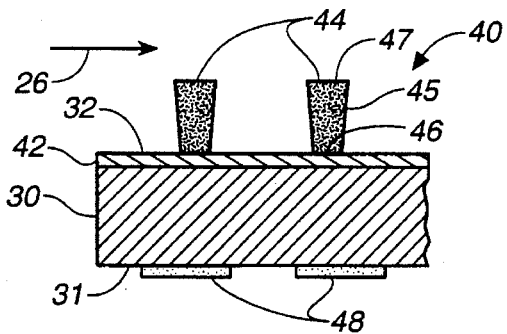
FIG._6
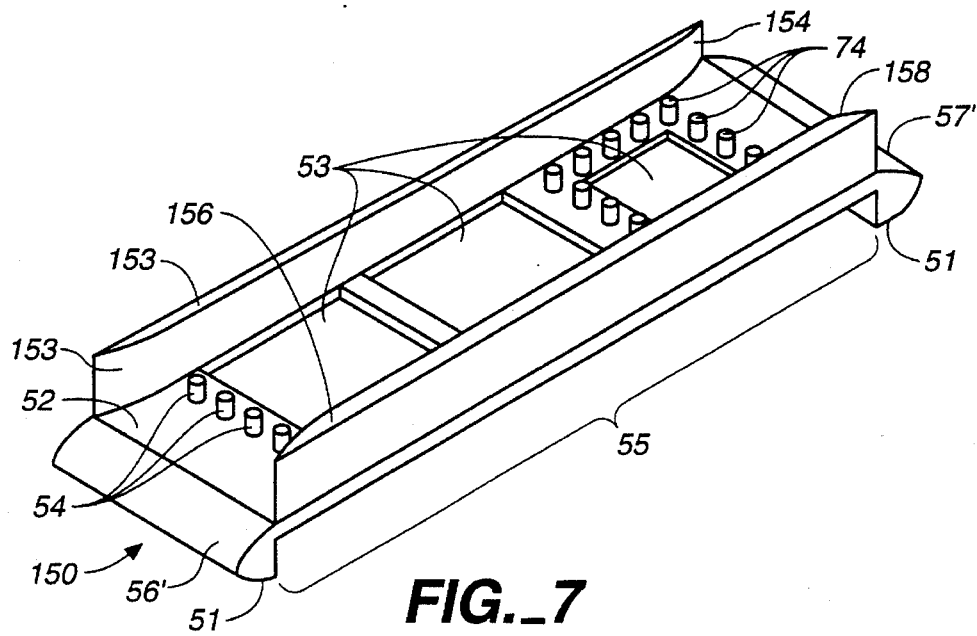
FIG._7

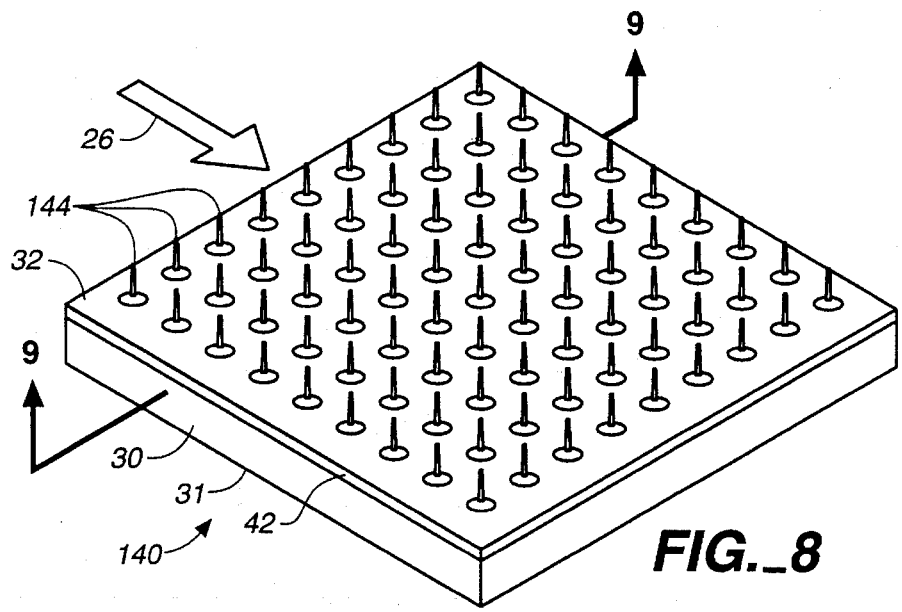
FIG._8
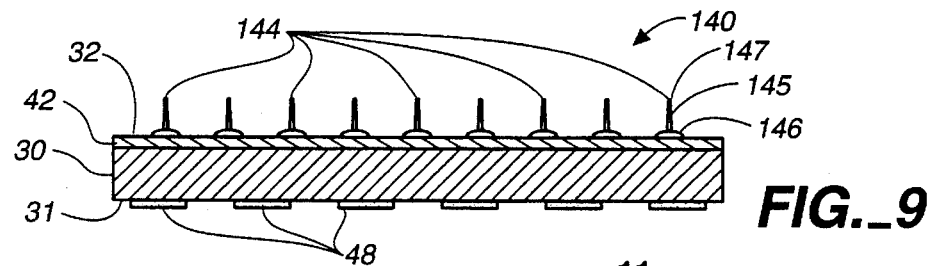
FIG._9
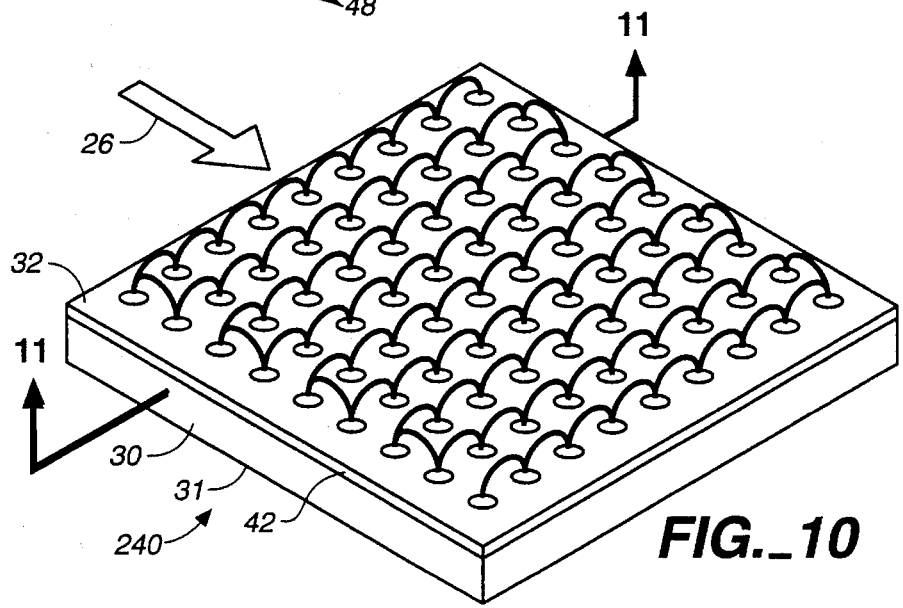
FIG._10
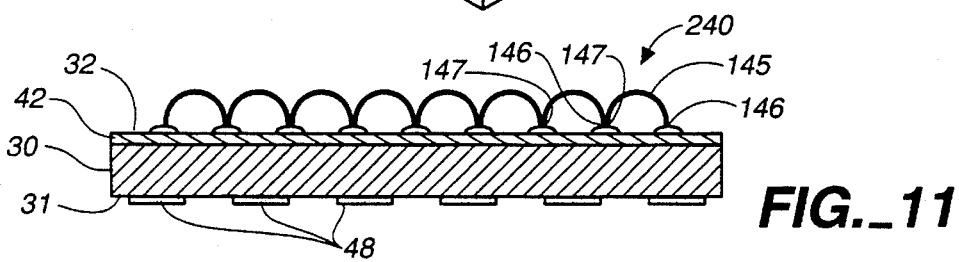
FIG._11

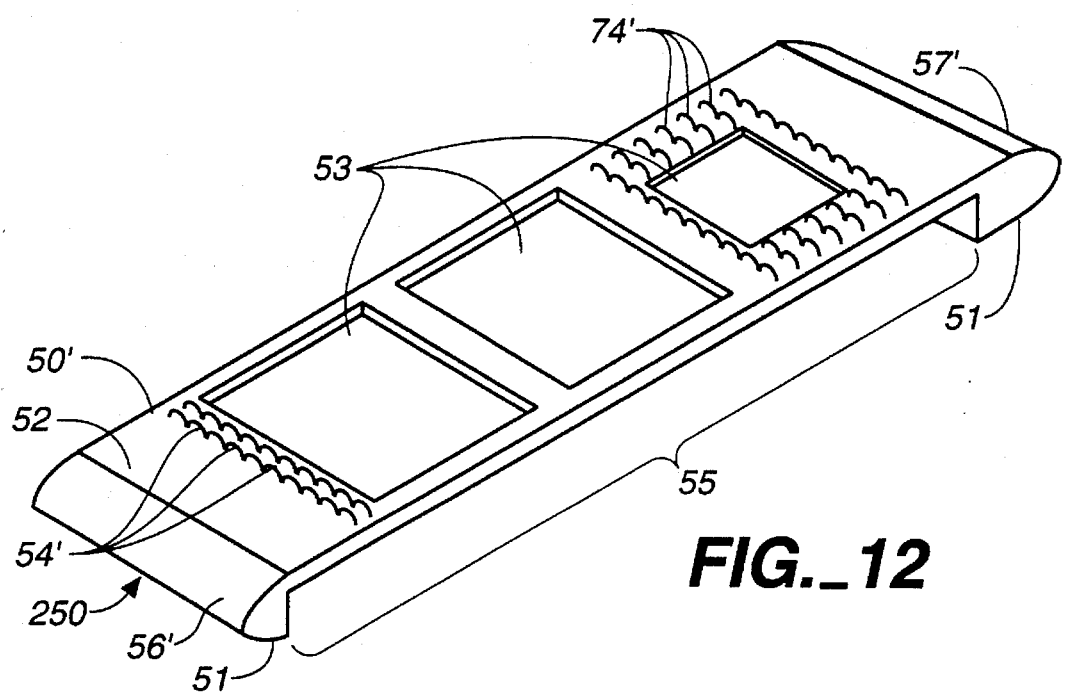
FIG._12

APPARATUS FOR COOLING SEMICONDUCTOR CHIPS IN MULTICHIP MODULES

FIELD OF THE INVENTION

The present invention relates to means for cooling semiconductor chips and other electronic heat producing components. In particular, the present invention relates to heat sinks for cooling IC chips in two- and three-dimensional chip packaging technologies. Additionally, the present invention relates to cooling systems for controlling the flow of cooling fluid over the chip heat sinks and preventing cavitation in the cooling fluid.

BACKGROUND OF THE INVENTION

High performance systems for computers and the like are evolving towards housing the semiconductor integrated-circuit (IC) chips of such systems in high-speed multichip arrays. Many of the IC chips in these high performance systems consume a relatively large amount of power (e.g., 20–125 Watts/cm$^2$ per chip), and consequently generate relatively large amounts of heat which must be removed. Unfortunately, the heat generation places a practical limit on the housing density of the IC chips. The design of such high-performance systems needs to recognize the problem of the heat generation and provide solutions thereto which can enable high densities of such chips, without significantly compromising the construction of high-speed signal interconnections between chips.

One conventional prior art approach of removing heat from a group of IC chips mounts the back surfaces of the IC chips to a heat conductive base plate and interconnects the IC chips to one another, and to outside signal lines, with wire bond interconnections. Although good heat conduction may be achieved in this manner, the wire bond interconnections provide relatively slow signal propagation, as compared to many other interconnect technologies (e.g., flip-chip solder bump technology) due to relatively large inductance of each wire bond interconnection. As such, this approach is not well suited for dense, high-speed IC packaging.

A second prior art approach, which is more suited to a two-dimensional package, mounts the front surfaces of IC chips to a major supporting substrate with C$^4$ solder bumps (e.g., flip-chip bonding), with the major substrate providing power to the chips and electrical interconnections between chips. Spring loaded heat sinks mechanically coupled to back surfaces of the IC chips remove heat from the IC chips. While this is an acceptable approach for two-dimensional packaging, it is not well suited for three-dimensional packaging because the spring loaded heat sinks occupy a significant space (volume) above the major substrate which prevents close stacking of several interconnect substrates.

In a third prior art approach, as described in U.S. Pat. No. 5,079,619 to Davidson, the IC chips are housed in planar boards which may be stacked upon one another. Two slots are formed in one of the board's major surfaces, and a heat exchanging plate is positioned within the slots. The heat exchanging plate has a number of interior tubes formed within it which conduct a cooling fluid. Due to the formation of the cooling tubes, the heat exchanging plate is relatively thick, and the planar boards housing the IC chips are consequently thick. This presents a disadvantage for high speed communication of signals between planar boards as such signals must propagate through large vertical distances.

In yet another prior art approach, as described in U.S. Pat. No. 4,450,472 to Tuckerman, et al., a plurality of microchannels are etched in the back surface of an IC chip, and a cover is attached to the back surface to form a plurality of micro-cooling tubes. The channels are designed to carry a laminar flow of water. Manifolds for receiving and discharging the water coolant are attached at the ends of the micro-cooling tubes. Unfortunately, the construction of the micro-channels and the manifolds is expensive and difficult. Additionally, each chip is housed in a separate package, which is not favorable for high density packaging of IC chips.

To date, prior art cooling systems have not adequately addressed the simultaneous needs for high-speed signal communication in two and three dimensional systems and for efficient cooling of such systems. Accordingly, there is a need for compact, reliable, and highly efficient cooling systems suitable for densely packed, high-speed IC chips, that may be manufactured by relatively simple methods.

SUMMARY OF THE INVENTION

The present invention recognizes that a compact, reliable, and efficient cooling of semiconductor chips may be achieved by forming separate heat sink arrays on the back surfaces of the semiconductor chips, mounting the active surfaces of the chips to an interconnect substrate, and passing a cooling fluid over the heat sink arrays to directly cool the chips. The chips may be arranged in rows and one or more cooling channels may be formed around the rows to increase cooling efficiency by unifying the flow of the cooling fluid over the heat sink arrays. With the increased efficiency, the height of each cooling channel may be substantially reduced to allow close stacking of interconnect substrates for three-dimensional packages and to shorten the vertical communication time between the interconnect substrates. The heat sink arrays of the present invention do not significantly limit how closely the semiconductor chips may be mounted on the interconnect substrate, and therefore do not substantially impede the construction of short high-speed interconnects between IC chips mounted on the same substrate.

Broadly stated, the cooling system according to the present invention comprises a major substrate for enabling electrical connections to one or more semiconductor chips, each chip having an active surface coupled to the major substrate, and a channel formed above the major substrate and each chip for conducting a cooling fluid over the back surface thereof. The channel includes a bottom surface at the major substrate, a top surface positioned above the bottom surface, a first end for receiving a cooling fluid, and a second end for discharging the cooling fluid. The cooling system further includes a heat sink array for each chip of a selected number of chips, the heat sink array being formed on the back surface of the corresponding chip and including a plurality of heat conducting elements attached to the chip's back surface. In a preferred embodiment, the cooling system further comprises a cavitation and flow control plate disposed at the bottom surface of the cooling channel and formed around the edges of the one or more semiconductor chips. The plate controls the flow of cooling fluid around the chip edges, and aids in preventing cavitation of the cooling fluid, which is the sudden formation and collapse of low-pressure bubbles in liquids caused by a change in pressure in the fluid flow.

A heat sink array according to the present invention comprises a plurality of heat conducting elements formed on the back surface of a semiconductor chip, or the like. Each heat conducting element comprises a body attached to the back surface of the semiconductor chip. In one preferred embodiment, the heat conducting elements comprise wires and are attached to the chip's back surface with a wire bonding apparatus. Such wires may comprise any of the commonly available types used in wire-bonding, including round wires and ribbon wires. In another preferred embodiment, the heat conducting elements comprise posts which are constructed on the chip's back surface by forming heat conducting material within a patterned spacer layer, which is removed after the posts are formed.

A cavitation and flow control plate according to the present invention comprises one or more apertures formed within the plate, each such aperture configured to receive a corresponding semiconductor chip therewithin. In one preferred embodiment, a shock-absorbing structure is disposed near the first channel end which receives the cooling fluid to absorb mechanical shocks present in the cooling fluid. This shock-absorbing structure may comprise a plurality of elements similar to the heat conducting elements of the heat sink arrays. In other embodiments, the plate's forward edge near the first channel end comprises a streamlined surface which smoothly directs the flow of fluid into the channel and onto the plate, before it flows over the semiconductor chips.

Accordingly, it is an object of the present invention to provide a heat removing cooling system for semiconductor chips which enables close spacing of the chips for high speed communications capable of efficiently removing large amounts of heat.

It is another object of the present invention to provide an efficient system for a plurality of interconnected semiconductor IC chips to enable high densities of such chips without significantly compromising the construction of high-speed signal interconnections between the IC chips.

It is another object of the present invention to provide an efficient and reliable cooling means for a semiconductor chip which may be readily constructed.

It is a further object of the present invention to minimize and prevent flow disturbances in a cooling fluid which adversely impact on the efficiency of cooling and the operation of semiconductor chips being cooled by the fluid.

These and other objects of the present invention will become apparent to those skilled in the art from the following detailed description of the invention, the accompanying drawings, and the appended claims.

BRIEF DESCRIPTION OF THE DRAWINGS

FIG. 1 shows an expanded isometric view of a first embodiment of the system according to the present invention for cooling semiconductor chips and the like.

FIG. 2 shows a cross-sectional view of the system shown in FIG. 1, as taken in the cross-sectional plane shown in FIG. 1.

FIG. 3 shows an expanded isometric view of a second embodiment of the system according to the present invention for cooling semiconductor chips and the like.

FIG. 4 shows a cross-sectional view of the system shown in FIG. 3, as taken in the cross-sectional plane shown in FIG. 3.

FIG. 5 shows a partial isometric view of the first heat sink army embodiment shown in FIGS. 1–4 for cooling semiconductor chips and the like according to the present invention.

FIG. 6 shows a partial cross-sectional view of the heat sink array embodiment shown in FIGS. 1–5, as taken in the cross-sectional plane shown in FIG. 5.

FIG. 7 shows an isometric view of a third cavitation and flow control plate embodiment according to the present invention.

FIG. 8 shows an isometric view of a second heat sink array embodiment for cooling semiconductor chips and the like according to the present invention.

FIG. 9 shows a cross-sectional view of the heat sink array embodiment shown in FIG. 8, as taken in the cross-sectional plane shown in FIG. 8.

FIG. 10 shows an isometric view of a third heat sink array embodiment for cooling semiconductor chips and the like according to the present invention.

FIG. 11 shows a cross-sectional view of the heat sink array embodiment shown in FIG. 10, as taken in the cross-sectional plane shown in FIG. 10.

FIG. 12 shows an isometric view of another embodiment of the cavitation and flow control plate according to the present invention wherein the shock absorbing elements and flow control elements comprise wire bodies.

DETAILED DESCRIPTION OF THE INVENTION

An isometric view of a first embodiment of a semiconductor chip cooling system according to the present invention is shown at 10 in FIG. 1, and a cross-sectional view thereof is shown in FIG. 2. Cooling system 10 comprises a major substrate 12 for receiving a plurality of semiconductor chips 30, side walls 14 and 16 disposed at two opposing edges of substrate 12 and attached thereto, and a top substrate 18 positioned above major substrate 12 and attached to side walls 14 and 16. A cooling channel 20 is formed within the volume enclosed by substrates 12 and 18 and side walls 14 and 16. Semiconductor chips 30 are disposed within cooling channel 20, being mounted, attached, or otherwise coupled to major substrate 12 at their active surfaces by an interconnection means, such as for example solder bumps 49, as described in greater detail below with reference to FIG. 2. Other interconnection means, such as interposers, may be used. Chips 30 may be arranged in a single row, or may be arranged in two or more rows. Top substrate 18 is preferably removable to enable the mounting of chips 30.

Major substrate 12 preferably includes electrical connection means for coupling electrical signals to the semiconductor chips 30. In preferred embodiments, the connection means is capable of providing interconnects among the chips. Additionally, in a three-dimensional multi-chip module embodiment, top substrate 18 may have semiconductor chips mounted to its top surface, and may have a second cooling channel formed above it. Top substrate 18 may also have electrical connections means similar to that of substrate 12. Side walls 14 and 16 may comprise electrical connection means, which may couple electrical signals between substrates 12 and 18.

Channel 20 conducts a cooling fluid over the back surfaces of chips 30. The direction of fluid flow is shown by flow lines 26 in the Figures. Channel 20 has a bottom surface at major substrate 12, a top surface above the bottom surface and at top substrate 18, a first end 22 for receiving the cooling fluid, and a second end 24 for discharging the cooling fluid. The cooling fluid is suitably non-conductive and non-corrosive. For maximum heat removal, the cooling fluid comprises a liquid. The length of channel 20 extends between ends 22 and 24, and the width of channel 20 extends between side walls 14 and 16. The height, or depth, of channel 20 extends between the channel's top and bottom surface (i.e., substrates 12 and 18).

The components described herein which contact or are immersed in the cooling fluid should be chemically compatible with the cooling fluid (i.e., the components preferably do not adversely react with the cooling fluid). The cooling fluid may comprise a chemically inert material, such as for example the FLUORINERT Series of liquids manufactured by the 3M Corporation. Alternately, the components may be made from materials which are inherently compatible with a given cooling fluid, or may be coated by a protective layer of a material which is compatible with the fluid. For example, where the cooling fluid comprises water, a silicone gel die coat may be used to prevent components from reacting with the water. Of particular concern is the protection of the active surfaces of IC chips. Knowledge of, or determination of, the chemical compatibility between common cooling fluids and common IC chip materials, coating materials, and MCM materials is well within the ordinary skill in the MCM and packaging arts. Accordingly, detailed listings of chemically compatible materials, or additional examples of inert cooling fluids and protective coatings are not necessary in order to understand the present invention and enable one of ordinary skill in the art to make and use the same.

A cavitation and flow control plate 50 is preferably disposed at the bottom surface of channel 20 and formed around the edges of the one or more semiconductor chips 30 and, preferably, flush therewith. Plate 50 includes a first major surface 51 for contacting the bottom surface of the channel 20, a second major surface 52 substantially coplanar to first major surface 51, a number of apertures 53 formed through the body of the plate and between the plate's major surfaces 51 and 52. Each aperture 53 is configured, i.e., shaped, to receive a corresponding chip 30 therewithin. Preferably, second major surface 52 is substantially flush with the back surfaces of chips 30, so as to form a substantially continuous surface with the chips' back surfaces. With plate 50 situated within cooling channel 20, cooling fluid is conducted through a large portion of the channel's cross-section, but not the entire cross-section due to the thickness of plate 50.

Plate 50 controls the flow of cooling fluid around the chip edges, preventing recirculating eddies from forming in the space between adjacent chips 30. Such eddies increase the pressure drop along the channel, thereby making it more difficult to move the fluid through channel 20. Such eddies can also cause cavitation. The rapid creation and collapse of gas bubbles caused by cavitation can produce relatively high pressures on side walls 14 and 16 and substrates 12 and 18, which can break off material from these components as well as from chips 30. Such gas bubbles can also impair the cooling efficiency of the fluid. Accordingly, plate 50 reduces unwanted pressure drops though channel 20, and prevents cavitation therein. Further features and benefits of plate 50 are described below.

Without plate 50, fluid flow 26 can push against the front edge of the first chip 30 in the channel, and thereby add stress to the interconnects (e.g., solder bumps 49) which couple the active surface of chip 30 to major substrate 12. Such added stress increases the chances of the interconnects fatiguing and failing. Plate 50 shields the front edge of the first chip 30 from direct fluid impact, and thus lowers the stress on the first chip.

Cooling system 10 also comprises a number of heat sink arrays 40, each comprising respective pluralities of heat conducting elements 44 formed on the back surfaces of the chips 30. Heat sink arrays 40 are situated within the flow of cooling fluid to enhance heat transfer from chips 30 to the fluid. The heat sink arrays increase the surface areas of chips 30's back surfaces and, as explained further below, generate turbulence in the fluid near the chip back surfaces to increase the rate of heat transfer from the chips' to the fluid. FIG. 5 shows a partial isometric view of one heat sink array 40, as formed on a chip 30, and FIG. 6 shows a partial cross-sectional view thereof. The active surface of chip 30 is indicated by reference numeral 31, and the back surface thereof is indicated by reference numeral 32. As best shown in FIG. 6, each heat conducting element 44 comprises a body 45 having a first end 46 and a second end 47. Each first end 46 is attached to back surface 32 of chip 30. FIG. 6 also shows the active surface 31 with electrical interconnect pads 48 formed thereon prior to mounting on a major substrate. Pads 48 may be attached to major substrate 12 by a number of means well known in the art, such as $C^4$ solder bumps 49 shown in FIG. 2.

In the embodiment shown in FIGS. 5 and 6, each heat sink element body 45 comprises an elongated post of heat conducting material. The posts preferably have substantially the same diameter and substantially the same height. The posts are preferably formed with a density which provides a collective exposed surface area which is more than approximately one-third of the area of the chip's back surface. Exemplary post diameters may range between approximately 5 μm and approximately 500 μm, and exemplary post heights may range between approximately 10 μm and approximately 1,000 μm.

In one heat sink army embodiment of the present invention, the posts have heights of approximately 40 μm, have diameters of approximately 12.5 μm (tapered with~10 μm diameter at first end 46 and~15 μm at second end 47), and may have center spacing distances as small as approximately 30 μm, corresponding to densities of up to approximately 110,000 per square centimeter when formed on a square grid pattern. In another heat sink array embodiment of the present invention, the posts have heights of approximately 380 μm, have diameters of approximately 254 μm, and center spacing distances of approximately 500 μm.

Although they may only contact a small portion of the back surface of the chip, heat conducting elements 44 are positioned within the main portion of the fluid flow and thereby are able to readily transfer heat to the coolant. Heat conducting elements 44 also generate turbulence in the fluid flow near the chip's back surface 32 which increases the heat transfer rate at the chip's back surface. As is known in the art, when a laminar flow of fluid passes over a flat surface S at a velocity V, a small layer of fluid having a velocity substantially less than velocity V is formed directly above the surface S, with the laminar flow occurring above this small layer. This layer is often called the static boundary layer and may significantly impede the transfer of heat from the surface to the fluid flow, as the heat must be conducted through the layer before it can be removed by the flow. By introducing turbulence near the surface, as done by the conducting elements, the thickness of the static boundary layer is significantly reduced and the heat transfer rate is significantly improved.

Heat sink array 40 preferably further comprises an adhesion surface 42 formed on back surface 32. Heat conducting elements 44 are attached to adhesion surface 42, which is preferably provided by one or more metal layers.

Adhesion surface 42 and post elements 44 are preferably formed by standard semiconductor processes. The one or more metal layers of adhesion surface 42 may be formed on the chip's back surface by any suitable process, such as for example sputtering, evaporation, electroplating, or a suitable combination thereof. Post heat conducting elements 44 are preferably formed on adhesion surface 42 by photolithography, e.g., the steps of forming a spacer layer on the chip's back surface, removing a plurality of portions of the spacer layer where elements 44 are to be formed, and forming a heat conductive material within the removed portions. The remaining portions of the spacer layer are then removed. In one embodiment of the present invention, adhesion surface 42 comprises a thin sputtered layer of chromium or titanium followed by a thin sputtered layer of copper, the spacer layer comprises a photo-resist material which is exposed and developed to remove the spacer layer portions, and post elements 44 comprise copper which is electroplated into the removed portions. The sputtered layer of chromium or titanium preferably has a thickness of at least approximately 30 nm, and the sputtered copper layer preferably has a thickness of at least approximately 100 nm. With these methods, extremely high densities of heat conducting elements 44 may be obtained.

Unless shielded, the heat conducting elements 44 disposed nearest first channel end 22 will absorb the initial flow force of the cooling fluid, which will thereby add stress to the interconnects that attach the active surface of the chip to major substrate 12. To minimize the absorption of this shock and the stress on the interconnects, cavitation and flow control plate 50 preferably further comprises a plurality of shock absorbing elements 54 attached to top major surface 52 of plate 50, near first channel end 22 and in front of IC chips 30. Elements 54 absorb the initial impact, or initial mechanical shock, of the cooling fluid (26) as it first enters channel 20. Additionally, elements 54 absorb any shock waves present in the cooling fluid due to the starting of the fluid flow upon power up of the system. The absorption of the shock reduces the fluid forces on heat conducting elements 44 of the first chip and the stress on the interconnects of the first chip. Additional examples of shock absorbing elements are shown in FIGS. 3, 4, 7 and 12, which are discussed below.

Shock absorbing elements 54 need not be formed of a heat conducting material and may be integrally formed as part of plate 50, as for example formed by injection molding. Elements 54 preferably have a shape similar or substantially similar to the shape of heat conducting elements 44, and may be disposed in a pattern which substantially conforms to the pattern of elements 44 (e.g., elements 44 and 54 may be disposed in a common pattern).

In a preferred embodiment, plate 50 further comprises streamlined edges near channel ends 22 and 24 to direct the flow of cooling fluid smoothly into and out of channel 20 and to minimize step discontinuities in the flow's cross-section. Such edges aid in preventing eddies and cavitation at the edges of plate 50, and in lowering the pressure drop through channel 20. The streamlined edges may be beveled or curved (e.g., rounded). As an example, a beveled forward edge 56 is shown at channel end 22, and a curved streamlined backward edge 57 is shown at channel end 24, which is best seen in FIG. 2. However, forward edge 56 may be curved or otherwise streamlined, and backward edge 57 may be beveled or otherwise streamlined. Additional examples of streamlined edges are shown in FIGS. 3, 4, 7, and 12, which are discussed below.

In some system applications, some chips 30 have smaller dimensions than other chips 30, as for example shown in FIGS. 1 and 2 by the smaller IC chip 30' nearest channel end 24. When heat conducting elements 44 are disposed on chip 30', which is narrower than the channel width and does not span substantially the entire width of channel 20, the cooling fluid (26) tends to bypass around it and not cool it as effectively as the larger, upstream chips 30. To minimize the bypassing, plate 50 may further comprise flow constricting means 61 and 62 attached to its top major surface 52, nearby and along respective side edges of the aperture 53 for the smaller chip 30', as best shown in FIG. 1. Flow constricting means 61 and 62 run substantially parallel to the flow direction 26 of the cooling fluid and are generally disposed opposite one another (e.g., on opposing side edges of the aperture 53 which run parallel to the flow). Flow constricting means 61 and 62 concentrate the flow of cooling fluid over the aperture 53, thereby minimizing or preventing the bypassing of the cooling fluid around the smaller chip 30'.

Each flow constricting means 61 and 62 preferably comprises a surface defining member having a height substantially equal to the height of the channel less the thickness of plate 50. Each surface defining member has a forward surface portion 64 shaped to direct the flow of the cooling fluid toward and over the aperture 53, a backward surface portion 66 shaped to broaden the width of the fluid flow as it flows away from the aperture 53, and a middle surface portion 65 disposed between the forward and backward surface portions 64 and 66. Forward surface portion 64 narrows the width of the fluid flow cross-section as it approaches the aperture 53, and backward surface portion 66 expands the width of the cross-section as the fluid flow flows away from the aperture 53. Forward surface portion 64 preferably extends from a point located near one side of plate 50 and upstream from the aperture 53 to a second point near the upstream end of the aperture. Middle surface portion 65 preferably extends from this second point downstream to a third point near the downstream end of the aperture 53, and preferably abuts the corresponding side edge of the aperture 53. Backward surface portion 66 extends from this third point to a fourth point located near the plate side and further downstream from the aperture 53. In a preferred embodiment of the present invention, chip 30' is centered in channel 20 and flow constricting means 62 comprises a mirror image of flow constricting means 61.

Although the surfaces 64–66 shown in the embodiment of FIG. 1 are flat, these surfaces may be curved or otherwise shaped to improve the velocity profile of the flow across the smaller chip 30', to reduce eddies, to lower pressure drops in channel 20, and to prevent cavitation. Furthermore, although middle surface portion 65 is shown as abutting a side edge of the aperture 53, it may be spaced apart from this edge so as to reduce the pressure drop in channel 20 by widening the flow's cross-sectional area. Although this widening would allow some of the cooling fluid to bypass around the smaller chip 30', flow constricting means 61 compensates by increasing the flow velocity of the cooling fluid over the smaller chip 30'. Preferably, flow control means 61 and 62 are positioned to cause the flow resistance in the region of the channel adjacent to aperture's side edge to be greater than the flow resistance over chip 30' in the aperture. Additionally, although the surface defining member is shown as a solid in the embodiment of FIG. 1, the surface defining member may have a hollow interior.

As an alternative way of minimizing or preventing the bypassing of fluid flow around the smaller chip 30', flow control elements, preferably similar to elements 44 and 54; may be disposed on top surface 52 of plate 50, around the side edges of the smaller chip 30'. This alternative is described with reference to a second embodiment of a semiconductor chip cooling system according to the present invention shown at 100 in FIGS. 3 and 4. FIG. 3 shows an isometric view thereof, and FIG. 4 shows a cross-sectional view thereof. As with cooling system 10, cooling system 100 comprises major substrate 12, side walls 14 and 16, channel 20, and the cooling fluid (26). In contrast with system 10, system 100 comprises an alternative cavitation and flow control plate 50'. Like plate 50, plate 50' includes major surfaces 51 and 52, and a number of apertures 53, with second major surface 52 being substantially flush with the back surfaces of chips 30. In contrast, plate 50' comprises a plurality of flow control elements 74 disposed around the edges of the aperture 53 for the smaller chip 30'. A number of flow control elements 74 are preferably disposed along the aperture's side edges which are substantially parallel to the flow 26 of the cooling fluid. These elements preferably cause the velocity profile across the chip's width to be more uniform. Preferably, flow control elements 74 cause the flow resistance in the region of the channel adjacent to the aperture's side edge to be approximately equal to or greater than the flow resistance over chip 30' in the aperture. A number of elements 74 may also be disposed along the aperture's side edges which are substantially perpendicular to the flow 26 of the cooling fluid as shock absorbing elements. Elements 74 need not be formed of a heat conducting material and may be integrally formed as part of plate 50'.

System 100 further comprises an alternative top substrate 18', a second major substrate 112 similar to major substrate 12 and positioned therebelow, and side walls 114 and 116 similar to side walls 14 and 16, respectively. Top substrate 18' includes a streamlined forward edge 118 and a streamlined backward edge 119 shaped to better direct the flow 26 of the cooling fluid into and out of channel 20 and to prevent eddies. Major substrates 112 and 12, and side walls 114 and 116 are arranged to form a second cooling channel 120 immediately below first channel 20. Semiconductor chips are mounted on substrate 112 (see FIG. 4), in close proximity to chips 30 on substrate 12, and signal communication lines (not shown) may be formed between substrates 112 and 12 through one or both of side walls 114 and 116, thereby providing a compact three-dimensional package for high-performance integrated circuit chips and the like.

As with plate 50, plate 50' also includes a streamlined forward edge 56' near channel end 22 and a streamlined backward edge 57' near channel end 24, each shaped to better direct fluid flow into channel 20. For directing cooling fluid into second channel 120, plate 50' also includes a recess 55 formed into major surface 51 such that recess 55 fits over major substrate 12 at channel ends 22 and 24, forming overhanging lips thereat. Recess 55 enables bottom plate surface 51 to be positioned in close proximity to the top surface of channel 120 (bottom of substrate 12) so that edges 56' and 57' may also be streamlined to direct fluid into second channel 120, as shown in FIGS. 3 and 4. Preferably, recess 55 has a depth substantially equal to the thickness of major substrate 12 so that bottom plate surface 51 is substantially flush with the top surface of channel 120 (bottom of substrate 12), thereby forming a continuous surface therewith. Additionally, when recess 55 conforms to the leading edge of substrate 12, the forces applied to forward edge 56' from the cooling fluid may be translated to substrate 12 rather than the leading edges of chips 30.

Each of plates 50 and 50' may be held in place by various means. For example, plates 50 and 50' may be glued, soldered, mechanically attached or held in place by side walls which extend over the height of channel 20 so as to fit tight against top substrate 18. The latter means is shown at 150 in FIG. 7 in a third embodiment of the cavitation and flow control plate according to the present invention. In addition to surfaces 51 and 52, apertures 53, recess 55, edges 56' and 57', and flow control elements 74, plate 150 includes side walls 152 and 156 attached to plate surface 52 and disposed along the side edges of plate 150. Each of side walls 152 and 156 preferably has a height substantially equal to the height of cooling channel 20 less the thickness of plate 150, thereby fitting between top substrate 18 and top plate surface 52, and substantially preventing vertical movement of plate 150. Side walls 152 and 156 preferably include streamlined forward edges 153 and 157, respectively, and streamlined backward edges 154 and 158, respectively, shaped to directed fluid into and out of channel 20 and to provide the same advantages as the previously described streamlined edges.

Side walls 152 and 156 preferably contact side walls 14 and 16, respectively, to prevent lateral movement of plate 150 along the width of the channel. Recess 55 may be used to prevent lateral movement of plate 150 along the length of the channel. Recess 55, and side walls 152 and 156 may thereby lock plate 150 into the channel without the need for other attachment means. In this way, plate 150 may be readily removed when top substrate 18 is removed.

Additional embodiments of the heat sink array according to the present invention are now described. An isometric view of a second embodiment, as formed on a chip 30, is shown at 140 in FIG. 8, and a cross-sectional view thereof is shown in FIG. 9. The chip 30, it's active surface 31 with interconnection pads 48, and its back surface 32 are shown in FIGS. 8 and 9. The cooling fluid and its direction of flow over the chip 30 is shown at 26. Heat sink array 140 comprises a plurality of post-shaped heat conducting elements 144 formed on back surface 32 of the chip 30 by wire bonding machines and wire bonding methods. As best shown in FIG. 9, each heat conducting element 144 comprises a wire body 145 having a first end 146 and a second end 147. The first ends 146 are attached at back surface 32, and the second ends 147 are left exposed so as to contact the cooling fluid. As with heat sink array 40 shown in FIGS. 1–6, an adhesion surface 42 is preferably formed on back surface 32, with ends 146 being attached to adhesion surface 42.

Heat conducting elements 144 may be formed as ball bonds, as shown in FIGS. 8 and 9, where a ball of wire material is formed at first end 146 of each element where the end contacts adhesion layer 42. Heat conducting elements 144 may also be formed as wedge bonds, where a small portion of wire is bent at the first end before the first end is attached to the adhesion layer. Additionally, heat conducting elements 144 may comprise any of the commonly available types of wires used in wire-bonding, including round wires and ribbon wires, the latter having substantially rectangular, or slotted, cross-sections.

In one implementation of the embodiment, adhesion surface 42 comprises a layer of chromium and a layer of gold over the chromium, each layer being formed by conventional processing steps and preferably having a thickness of at least approximately 100 nm. Wire elements 144 have a height of approximately 250 μm (~10 mils) and a diameter of approximately 31 μm (~1.25 mils), and are spaced on centers of approximately 200 μm (~8 mils). On back surface 32, a border approximately 1 mm wide is provided around the edges of chip 30 to provide a working area for pick-up tools. On a square chip measuring 1 cm on a side, the wire elements in this implementation provide a surface area of approximately 0.48 square centimeters, which provides approximately a 48% increase in surface area for cooling.

It may be appreciated that adhesion surface 42 may alternately comprise other suitable materials formed on back surface 32 or suitable surface treatments of surface 32. In view of the specification, those skilled in the art will recognize that adhesion surface 42 may be formed continuously over substantially the entire back surface of chip 30, or may be formed as a plurality of separate bonding pad areas thereover. Additionally, wire elements 144 may be formed with different heights, diameters, widths, thicknesses, and center-to-center spacing distances. Typical round wires used in wire bonding have diameters ranging between ~12.5 µm to ~500 µm, and typical ribbon wires have thicknesses ranging between ~6.25 µm to ~50 µm and widths ranging between ~75 µm to ~1,000 µm. Exemplary heights may range between ~10 µm to ~1,000 µm, and center-to-center spacing distances may be as low as 100 µm or less. Although elements 144 are arranged with their first ends 146 located on a square grid pattern, elements 144 may be arranged with other patterns, such as for example a rectangular lattice, or a hexagonal lattice.

In a third heat sink array embodiment according to the present invention, the wire elements 144 are looped from one bonding site to the next to form a "chain" of wire loops, rather than cut off to expose the second ends. FIG. 10 shows a partial isometric view of the embodiment at 240 and FIG. 11 shows a partial cross-sectional view thereof. Both ends are attached to adhesion surface 42 at back surface 32, with the bodies 145 formed with semi-loop shapes. The second end 147 of each element 144 is preferably attached to adhesion surface 42 next to the first end 146 of another element. The bonds may therefore be formed without wire cut operations, thus saving manufacturing time. The chain may be formed by two-bond thermosonic loops or by ultrasonic multiple bond stitches.

In one implementation of the embodiment, the chained wire bonds are placed on center pitches of 200 µm, and a 31 µm wire diameter is used. On a square centimeter chip with an outside border of 1 mm for pick-up tools, the chained wire bonds provide a surface area of 0.56 square centimeters, an increase of 56%.

In a preferred embodiment, a plurality of elements 144 have their semi-loop bodies oriented such that the cooling fluid flows through the semi-loops, i.e., through the areas formed between the semi-loops and the back surface. Preferably, each of these semi-loop bodies lies within a corresponding geometrical plane which is oriented substantially normal to the flow direction of the cooling fluid.

The wire-bond heat sink array embodiments shown in FIGS. 8–11 may be readily and inexpensively constructed with a wire bonding apparatus. Additionally, the wire bonding may be applied to any electronic device which is cooled in a liquid or gas fluid stream. Such a device may be a packaged IC chip, packaged semiconductor device (e.g., power rectifier or power transistor), and packaged passive components such as a resistor, inductor, or capacitor.

The shock absorbing elements 54 and flow control elements 74 of plates 50, 50', and 150 may comprise post bodies, as shown in FIGS. 1–7, or may comprise wire bodies, as shown in FIGS. 8–11. An exemplary embodiment of the control plate according to the present invention wherein the elements have wire shaped bodies is shown at 250 in FIG. 12. In contrast to plates 50, 50', and 150, plate 250 has looped wire shock absorbing elements 54' in place of post elements 54, and looped wire flow control elements 74' in place of post elements 74.

While the present invention has been particularly described with respect to the illustrated embodiment, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiment(s) but, on the contrary, is intended to cover various modifications and equivalent arrangements included within the scope of the appended claims.

What is claimed is:

1. A system for cooling a semiconductor chip having an active surface and a back surface opposite the active surface, said system comprising:

a major substrate, the active surface of the chip being positioned opposite to said major substrate;

a channel formed above said major substrate and the chip for conducting a cooling fluid over the back surface of the chip, said channel including a bottom surface, a top surface above said bottom surface, a first end for receiving a cooling fluid, and a second end for discharging the cooling fluid, said channel configured to direct said cooling fluid in a direction which is parallel to the back surface of the semiconductor chip; and a heat sink array formed on the back surface of the chip, said heat sink array including a plurality of heat conducting elements attached to the chip's back surface.

2. The system of claim 1 wherein said heat conducting elements comprise posts.

3. The system of claim 1 wherein said heat conducting elements comprise wire-bonded wires.

4. The system of claim 1 further comprising a control plate disposed within said channel and against said major substrate, said control plate including:

first and second substantially co-planar major surfaces, said first major surface being mounted on said major substrate; and one or more apertures formed within said control plate, each said aperture configured to receive a corresponding chip therewithin.

5. The system of claim 1 wherein said system cools one or more additional semiconductor chips, and where said heat sink array is only attached to one semiconductor chip and is independent of said one or more additional semiconductor chips.

6. The system of claim 3 wherein said wires form semi-loops attached to said back surface, each wire being attached to said back surface at both of its ends.

7. The system of claim 4 wherein said control plate further includes one or more shock absorbing elements disposed near said first end of said channel, said shock absorbing elements absorbing the initial flow force of the cooling fluid before the cooling fluid is conducted over the back surface of the chip.

8. The system of claim 4 wherein at least one semiconductor chip has a width narrower than the width of the channel, and wherein said system further comprises flow control means within said channel adjacent to an edge of one of said narrower chips such that the flow resistance in the region of the channel adjacent to said narrower chip edge is approximately at least as great as the flow resistance over said narrower chip.

9. The system of claim 4 wherein said control plate further includes a streamlined forward edge near the first end of the channel, said forward edge being shaped to smoothly direct fluid flow into the channel.

10. The system of claim 4 wherein said major substrate further comprises a forward edge at the first end of said channel, and wherein said control plate further comprises a forward edge at the first end of said channel having a lip which overhangs the forward edge of said major substrate.

11. The system of claim 4 wherein said second major surface of said control plate is substantially flush with the back surface of the semiconductor chip.

12. A heat sink array for a semiconductor chip having a front surface comprising an active area and a back surface opposite the front surface, said heat sink array comprising a plurality of heat conducting elements, each heat conducting element comprising a wire-bonded wire having a body with a first end and a second end, said first end being attached to the back surface of the semiconductor chip.

13. The heat sink array of claim 12 wherein the second end of each said element is attached to the back surface of the semiconductor chip.

14. The heat sink array of claim 13 wherein said heat sink array is immersed in a flow of cooling fluid, and wherein a plurality of said heat conducting elements comprise semi-loop wires, each wire being formed between the ends of its corresponding heat conducting element, and wherein a number of said wires are oriented such that cooling fluid flows through their respective semi-loops.

15. The heat sink array of claim 12 further comprising an adhesion surface formed on the chip's back surface, the first ends of said heat conducting elements being attached to said adhesion surface.

16. The heat sink array of claim 14 wherein each semi-loop wire lies within a corresponding geometrical plane, and wherein each plane is oriented substantially normal to the flow direction of the cooling fluid.

17. The heat sink array of claim 15 wherein said adhesion surface comprises a metal layer formed over the chip's back surface.

18. A heat sink array for an electronic component having a front surface for mounting to a major substrate and a back surface opposite the front surface, said heat sink array comprising a plurality of heat conducting wire-bonded wires, each wire having a first end and a second end, each first end being attached to the back surface of the electronic component.

19. The heat sink array of claim 18 further comprising an adhesion surface formed on the component's back surface, the first ends of said heat conducting elements being attached to said adhesion surface.

20. A control plate for use in a cooling channel which houses one or more semiconductor chips, the channel including a first end for receiving a cooling fluid and a second end for discharging the cooling fluid, said plate comprising:

one or more apertures formed within said plate, each said aperture configured to receive a corresponding chip therewithin; and one or more shock absorbing elements attached to said plate disposed in the channel near the first channel end.

21. The control plate of claim 20 wherein each semiconductor chip has a first surface mounted to a surface of the major substrate and a second surface opposite its first surface, and wherein said plate forms a substantially continuous surface with the second surfaces of thee one or more chips.

22. The control plate of claim 20 wherein said one or more shock absorbing elements comprise posts.

23. The control plate of claim 20 wherein said one or more shock absorbing elements comprise wires formed by wire bonding.

24. A control plate for use in a cooling channel which houses one or more semiconductor chips, the one or more semiconductor chips including a narrow chip which has a width narrower than the width of the channel, the channel including a first end for receiving a cooling fluid and a second end for discharging the cooling fluid, said control plate comprising:

one or more apertures formed within said control plate, each said aperture configured to receive a corresponding chip therewithin; and flow control means within the channel adjacent to an edge of the narrow chip such that the flow resistance in the region of the channel adjacent to the edge is approximately equal to or greater than the flow resistance over the narrow chip.

25. The control plate of claim 24 wherein said flow control means comprises one or more flow control elements attached to said control plate disposed along the edge of the narrow chip.

26. The control plate of claim 25 wherein said flow control means comprises a first flow constricting means attached to said control plate adjacent to the edge of the narrow chip for concentrating the flow of cooling fluid over the narrow chip.

27. The control plate of claim 26 wherein said flow control means further comprises a second flow constricting means attached to said control plate adjacent to a second edge of the narrow chip opposite to the narrow chip's first edge.

28. The control plate of claim 26 wherein the channel further includes a bottom surface at the surface of the major substrate, a top surface disposed above the bottom surface by a selected height; and wherein said first flow constricting means comprises a surface defining member having a height substantially equal to the channel's height less the thickness of said plate, and a forward surface portion shaped to direct the flow of cooling fluid toward and over said selected aperture and to narrow the width of the fluid flow as it approaches said aperture.

29. The control plate of claim 28 wherein said first flow constricting means further comprises a backward surface portion shaped to broaden the width of the fluid flow as it flows away from said selected aperture.

30. A control plate for use in a cooling channel which houses one or more semiconductor chips, the channel including a first end for receiving a cooling fluid and a second end for discharging the cooling fluid, said plate comprising:

one or more apertures formed within said plate, each said aperture configured to receive a corresponding chip therewithin; and a streamlined forward edge near the first end of the channel, said edge being shaped to smoothly direct fluid flow into the channel.

31. The control plate of claim 30 wherein said forward edge comprises a beveled surface.

32. The control plate of claim 30 wherein said forward edge comprises a curved surface.

33. The control plate of claim 30 further comprising a streamlined backward edge near the second end of the channel and shaped to directed fluid flow smoothly out of the channel.

34. The control plate of claim 30 wherein said one or more semiconductor chips are mounted on a first surface of a major substrate;

wherein said plate further comprises first and second substantially co-planar major surfaces, said first major surface for contacting the first surface of the major substrate;

wherein the major substrate further includes a second surface substantially coplanar to its first surface, and a forward edge at the first end of said channel;

wherein the channel is a first channel formed at the first surface of the major substrate, and wherein a second channel is formed at the second surface of the major substrate;

and wherein said plate further comprises a forward edge at the first end of said channel having a lip which overhangs the forward edge of said major substrate.

35. A heat sink array for a semiconductor chip having a front surface comprising an active area and a back surface opposite the front surface, said heat sink array comprising a plurality of heat conducting elements, each heat conducting element comprising a body having a first end and a second end, each of said first and second ends being attached to the back surface of the semiconductor chip.

36. The heat sink array of claim 35 wherein said heat sink array is immersed in a flow of cooling fluid, and wherein a plurality of said heat conducting elements comprise semi-loop wires, each wire being formed between the ends of its corresponding heat conducting element, and wherein a number of said wires are oriented such that cooling fluid flows through their respective semi-loops.

37. The heat sink array of claim 36 wherein each semi-loop wire lies within a corresponding geometrical plane, and wherein each plane is oriented substantially normal to the flow direction of the cooling fluid.

38. A heat sink array for a semiconductor chip having a front surface comprising an active area and a back surface opposite the front surface, said heat sink array comprising:

a metal layer directly formed over the back surface of the semiconductor chip by at least one of the processes of sputtering, evaporation, and electroplating; and a plurality of heat conducting elements, each heat conducting element comprising a body having a first end and a second end, said first end being directly attached to said metal layer.

39. A system for cooling a first semiconductor chip and a second semiconductor chip, each semiconductor chip having an active surface and a back surface opposite the active surface, said system comprising:

a first major substrate, the first semiconductor chip having its active surface positioned opposite said first major substrate;

a second major substrate disposed below said first major substrate and substantially coplaner to said first major substrate, the second semiconductor chips having its active surface positioned opposite said second major substrate;

a first heat sink array formed on the back surface of the first semiconductor chip and a second heat sink array formed on the back surface of the second semiconductor chip, each said heat sink array including a plurality of heat conducting elements attached to the back surface of its corresponding semiconductor chip;

a first channel formed above said first major substrate and the first semiconductor chip for conducting a cooling fluid over the back surface of the first semiconductor chip in a direction which is parallel to the back surface of the first semiconductor chip, said channel including a bottom surface at said first major substrate, a top surface above said bottom surface, a first end for receiving a cooling fluid, and a second end for discharging the cooling fluid; and a second channel formed above said second major substrate and the second semiconductor chip for conducting a cooling fluid over the back surface of the second semiconductor chip in a direction which is parallel to the back surface of the second semiconductor chip, said channel including a bottom surface at said second major substrate, a top surface at said first major substrate, a first end positioned adjacent to the first end of said first channel for receiving a cooling fluid, and a second end for discharging the cooling fluid, said first ends of said first and second channels forming a common fluid inlet.

40. The system of claim 39 further comprising a control plate fitted over said first major substrate and between the ends of said first channel, said control plate including a streamlined forward edge at the first ends of said first and second channels.

* * * * *

UNITED STATES PATENT AND TRADEMARK OFFICE
CERTIFICATE OF CORRECTION

PATENT NO. : 5,514,906
DATED : May 7, 1996
INVENTOR(S) : David G. Love, *et al.*

It is certified that error appears in the above-indentified patent and that said Letters Patent is hereby corrected as shown below:

Column 2, line 19, after "may" insert --be--.

Column 3, line 32, after "efficient" insert --cooling--.

Column 3, line 65, delete "army" and insert therefor --array--.

Column 6, line 8, delete "chip" and insert therefor --chips'--.

Column 6, line 34, delete "army" and insert therefor --array--.

Column 7, line 36, delete "power up" and insert therefor --power-up--.

Column 10, line 15, delete "directed" and insert therefor --direct--.

Column 13, line 66, delete "thee" and insert therefor --the--.

Column 14, line 22, delete "means-comprises" and insert therefor --means comprises--.

Column 15, line 1, delete "directed" and insert therefor --direct--.

Signed and Sealed this

Fourth Day of February, 1997

*Attest:*

BRUCE LEHMAN

*Attesting Officer*  *Commissioner of Patents and Trademarks*